(12) United States Patent
Klingberg et al.

(10) Patent No.: US 7,755,425 B2
(45) Date of Patent: Jul. 13, 2010

(54) METHOD AND APPARATUS FOR REDUCING FREQUENCY MEMORY EFFECTS IN RF POWER AMPLIFIERS

(75) Inventors: Mats Klingberg, Enskede (SE); Tony Fonden, Kista (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 122 days.

(21) Appl. No.: 12/296,324

(22) PCT Filed: Apr. 10, 2006

(86) PCT No.: PCT/SE2006/050065

§ 371 (c)(1),
(2), (4) Date: Oct. 7, 2008

(87) PCT Pub. No.: WO2007/117187

PCT Pub. Date: Oct. 18, 2007

(65) Prior Publication Data

US 2009/0256632 A1 Oct. 15, 2009

(51) Int. Cl.
*H03F 1/26* (2006.01)

(52) U.S. Cl. .................................. 330/149; 375/297
(58) Field of Classification Search .......... 330/149; 375/297; 455/114.3
See application file for complete search history.

(56) References Cited

U.S. PATENT DOCUMENTS

| 7,151,405 | B2 * | 12/2006 | Nezami | 330/149 |
| 7,657,405 | B2 * | 2/2010 | Singerl et al. | 703/2 |
| 2008/0144709 | A1 * | 6/2008 | McCallister et al. | 375/233 |
| 2008/0152037 | A1 * | 6/2008 | Kim et al. | 375/297 |

\* cited by examiner

*Primary Examiner*—Henry K Choe
(74) *Attorney, Agent, or Firm*—Rothwell, Figg, Ernst & Manbeck, P.C.

(57) ABSTRACT

The present invention relates to a predistorter for reducing memory effects in RF power amplifiers. The invention also relates to a method for reducing memory effects in RF power amplifiers and to a base station including such a predistorter. A predistorter according to the invention includes first means (1) for generating a first signal component, which is an estimate of a drain current of said amplifier, which means (1) for generating said first signal component comprises a linear filter, second means (8) for generating a second signal component as a function of said first signal component and at least one first gain function; third means (9) for generating a third signal component as a function of a conjugate of said first signal component and at least one second gain function, and fourth means (7) for combining at least said second signal component and said third signal component to form an output signal. The output signal from the predistorter is further used as input to the power amplifier, which when amplified reduces the memory effects of the amplifier.

18 Claims, 8 Drawing Sheets

METHOD AND APPARATUS FOR REDUCING FREQUENCY MEMORY EFFECTS IN RF POWER AMPLIFIERS

CROSS REFERENCE TO RELATED APPLICATION

This application is a 35 U.S.C. §371 National Phase Application from PCT/SE2006/050065, filed Apr. 10, 2006, and designating the United States.

TECHNICAL FIELD OF THE INVENTION

The present invention relates to power amplifying techniques in general and to a method and apparatuses for reducing frequency memory effects in (RF) power amplifiers in particular.

DESCRIPTION OF RELATED ART

Power amplifiers are indispensable components in a communication system and are known to add more or less distortion to the signal they are designed to amplify, especially in multicarrier telecommunications systems (e.g. WCDMA) which are particularly sensitive to distortion. The reason for this is that power amplifiers have a non-linear input-output signal characteristic. This results in a broadened spectrum around the desired amplified signal, and an unwanted in-band component of the signal, which lead to bad system performance.

To overcome this problem of distortion or to decrease the effects of non-linearity, several linearization schemes could be used. One such linearization scheme is known as feed-forward, where a signal is injected after the amplifier that cancels the non-idealities. Another linearization scheme usually used is to predistort (modify) the signal at the input of the amplifier in order to give an undistorted amplified signal at the output of the amplifier. This technique is called predistortion. There are many available predistortion techniques to choose from.

The U.S. Pat. No. 5,606,286 describes a predistortion technique in which a radio frequency signal is divided into three different parts which are individually exposed to different amounts of distortion and then recombined to form a single predistortion signal.

In the U.S. Pat. No. 4,453,133 predistortion components are developed by an amplifying device similar to a power amplifier, the linearity of which it is desirable to improve.

An additional problem with RF amplifiers used in multicarrier telecommunications systems (e.g. WCDMA) is the current consumption, or efficiency. A wideband signal has an average power that is normally much smaller than the peak power and the efficiency of a conventional amplifier drops rapidly when the power is reduced. This can however be countered by using e.g. a Doherty amplifier which is known to have better efficiency at backoff. A Doherty amplifier is described in W. H. Doherty, "A new high efficiency power amplifier for modulated waves," *Proc. IRE*, vol. 24 no. 9. pp. 1163-1182, September 1936.

Memory effects are another problem related to power amplifiers that can no longer be ignored. Moreover, higher power amplifiers such as those used in wireless base stations exhibit memory effects. Memory effects typically appear as a non-symmetrical spectrum around the carrier at the output of a power amplifier. That is, although the carrier (desired signal) spectrum is perfectly symmetrical, the spurious spectrum coming from distortion may be non-symmetrical with respect to the center of the carrier. The cause of memory effects can be electrical or electro-thermal as suggested in Joel Vuolevi, et al. "Measurement Technique For Characterizing memory Effects in RF Power Amplifiers", Dept. of Electrical Engineering and Infotech Oulu, IEEE 2000. pp. 195-198.

The methods used to handle non-linearity do not take into account memory effects of a power amplifier. In other words, distortion itself is not a memory effect, but any non-constant distortion behaviour at different modulation frequencies can be regarded as one. As the term "memory effects" indicates, there is dependence not only on the present input or sample, but also on previous inputs or samples of the signal.

In modern power amplifiers, memory effects are more pronounced due to fundamental drain voltage variations that occur because of non-constant i.e. frequency dependent load-impedance to the amplifier. These drain voltage variations occur because a load matching network of an amplifier used to transform the load impedance of the amplifier is composed of reactive components, making the matching network frequency dependent.

As a result, the drain voltage over the load matching network becomes frequency dependent which leads to variations in the drain voltage. In addition, because a transistor gain is very sensitive to variations in the drain voltage, a drain current generated by the transistor also becomes frequency dependent.

There is a theoretical way of designing a predistorter that takes care of all memory effects. This is called the Volterra series. The Volterra series is an extension to the well-known Taylor series, which can be used as a predistorter for memoryless amplifiers. The Volterra series, however also takes into account time-delayed terms that may quite accurately model the predistortion, and may therefore be used to suppress the distortion spectrum. However, a Volterra series quite rapidly gets large in terms of the number of possible terms in the expansion.

One common way of implementing memory in a predistorter is to cascade memoryless non-linear functions with linear filters. The Wiener and Hammerstein models are examples of possible realizations of this type of predistorter with memory.

Another approach of parameterizing a predistorter with memory is suggested in the international patent application WO 2004/086607. The advantage of the method described in this prior art is that it drastically reduces the number of parameters. In this prior art, instead of a multi-dimensional function of complex variables, only a number of single-dimensional functions of a real variable are used. Each function can be implemented in several ways, e.g. as a polynomial or by interpolation into a look-up table.

Yet another way of implementing a memory predistorter is to use a multi-dimensional table, addressed by filtered versions of the input signal power as described in the international patent application WO 01/05026.

SUMMARY OF THE INVENTION

None of the above mentioned prior art predistorters take variations in the drain voltage into account in a manageable way and are therefore not able to compensate for memory effects caused by such variations in a satisfactory way.

Therefore, in view of the above shortcomings of conventional predistortion schemes, there is a need for a predistortion apparatus that will compensate for memory effects due to variations in the drain voltage more accurately than the conventional predistortion apparatuses.

An object of the invention is thus to provide a method and arrangements for predistorting an input signal of a power amplifier in such a way as to compensate for memory effects caused by fundamental frequency drain voltage variations in RF power amplifiers.

The above stated object is achieved by means of a predistorter according to claim 1, a method according to claim 11, and a base station according to claim 18.

According to a first aspect of the invention, the above stated problem is solved by means of a predistorter for reducing frequency memory effects in a RF power amplifier. The predistorter according to the invention has a predistorter input signal and an output signal. The predistorter has first means for generating a first signal component, wherein said first signal component is an estimate of a drain current of said amplifier, and wherein said first means includes a linear filter. The predistorter further comprises second means for generating a second signal component as a function of said first signal component and at least one first gain function, which at least one first gain function represents the sensitivity of the power amplifier and is a function of the amplitude of a selected time-delayed version of said first signal component. The predistorter also comprises third means for generating a third signal component as a function of a conjugate of said first signal component and at least one second gain function, which at least one second gain function represents the sensitivity of the power amplifier and is a function of the amplitude of said selected time-delayed version of said first signal component. The predistorter further comprises fourth means for combining at least said second signal component and said third signal component to form said output signal.

According to a second aspect of the invention, the above stated problem is solved by means of a method for reducing frequency memory effects in a RF power amplifier using a predistorter having an input signal and an output signal. The method comprises the steps of: generating a first signal component by estimating a drain current of said power amplifier using a linear filter: generating a second signal component as a function of said first signal component and at least one first gain function: wherein said at least one first gain function represents the sensitivity of the power amplifier and is a function of the amplitude of a selected time-delayed version of said first signal component: generating a third signal component as a function of a conjugate of said first signal component and at least one second gain function, which at least one second gain function represents the sensitivity of the power amplifier and is a function of the amplitude of said selected time-delayed version of said first signal component: and generating an output signal by combining at least said second signal component and said third signal component.

According to a third aspect of the invention, the above stated problem is solved by means of a base station, which base station includes a predistorter that reduces frequency memory effects in a RF power amplifier of said base station.

An advantage with the present invention is that a more accurate predistorter is provided that effectively compensate for memory effects caused by variations in a drain voltage of an amplifier.

Another advantage with the present invention is that the predistorter can better correct for dynamic non-linearities, especially those generated by highly efficient amplifiers, such as Doherty or Chireix amplifiers, since highly efficient amplifiers are more sensitive to memory effects, especially those attributed to drain voltage variations.

Another advantage with some embodiments of the present invention is that the predistorter has faster tracking capabilities with enough degrees of freedom resulting in a more efficient power amplifier that can more accurately adapt to changes in memory effects.

Another advantage with some embodiments of the present invention is that the relatively few adjustable parameters give faster convergence speed for an adaptive predistorter.

Yet another advantage is that the predistorter according to the present invention is fairly simple to implement, and does not require complex calculations to be performed.

Another advantage is that the predistorter according to the invention can easily be combined with other predistorters as will be described and illustrated.

The present invention will now be described in more details by means of preferred embodiments and with reference to the accompanying drawings.

DETAILED DESCRIPTION OF PREFERRED EMBODIMENTS

Figure 1:
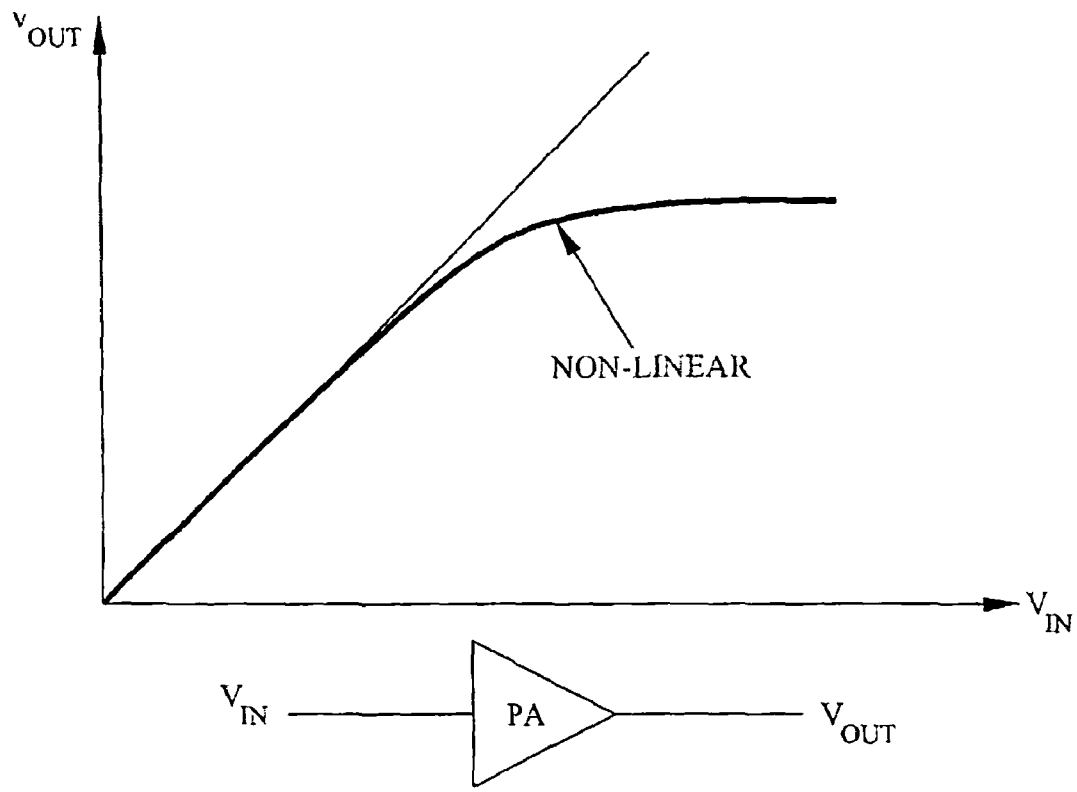
FIG. 1 is a diagram illustrating the non-linear input-output signal characteristics of a power amplifier.
Figure 2:
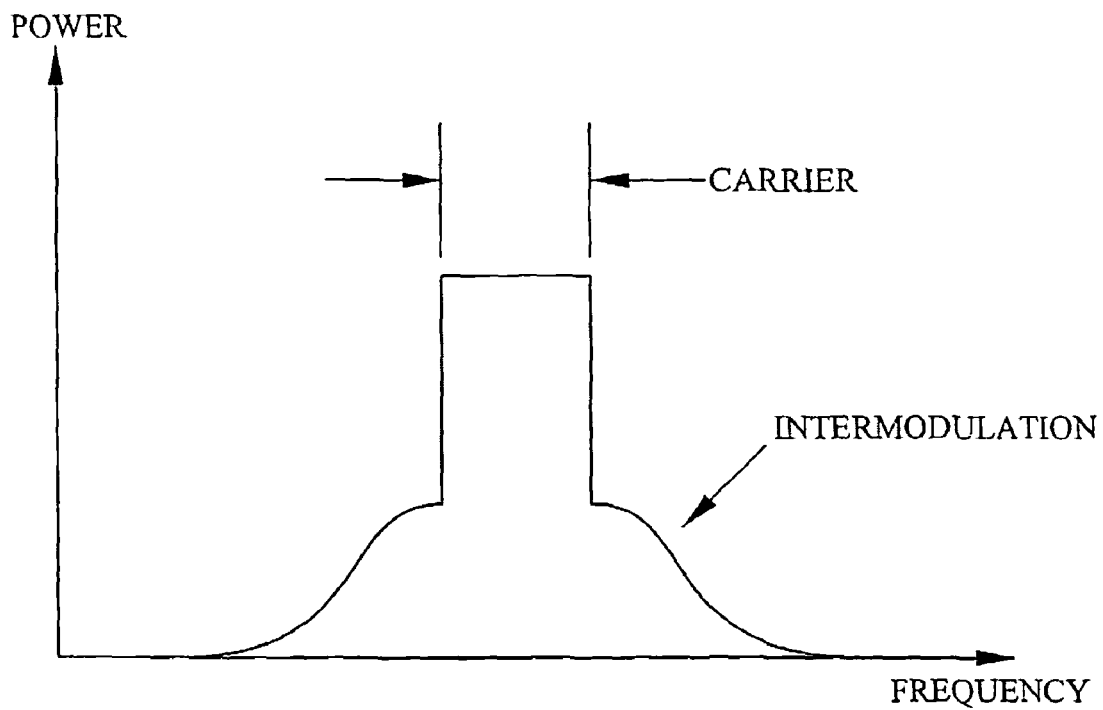
FIG. 2 is a schematic diagram illustrating the spectrum of the signal amplified by a non-linear power amplifier.
Figure 3:
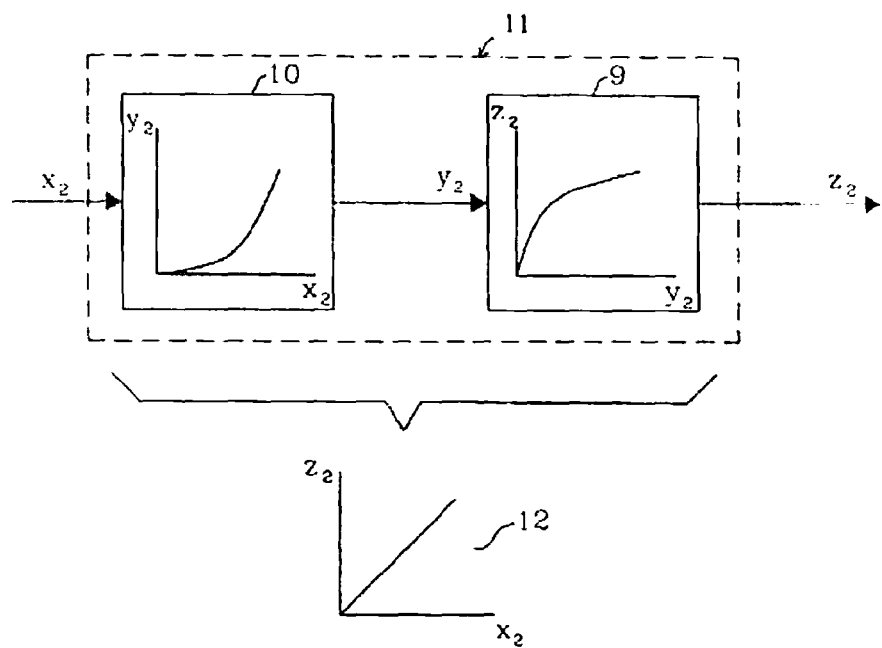
FIG. 3 is a schematic diagram illustrating the principle of predistortion.

FIG. 1 illustrates the non-linear input-output signal characteristic of a power amplifier. At low input signal amplitudes the amplifier is almost linear, but at higher amplitudes it becomes more and more nonlinear until it is saturated. This nonlinearity appears as a broadened spectrum around the desired amplified signal (and as an unwanted inband component of the signal), as illustrated in FIG. 2. To overcome this problem of nonlinearity, power amplifiers are usually connected to a linearizer. Of all linearization techniques, digital predistortion is among the most commonly used. A predistorter is a functional block that precedes the PA to give an undistorted amplified signal at the output of the amplifier as illustrated in FIG. 3. In FIG. 3, a power amplifier 9 is preceded by a predistorter 10. By letting the predistorter 10 and the amplifier 9 form a system 11 for which an output $y_2$ of the predistorter is the input of the amplifier, linearity is obtained for the whole system. A graph 12 illustrates that an input signal $z_2$ of the system 11 is a linear function of an input $x_2$ to the system 11. In practice, it is seldom possible to accomplish a perfect inverse to the nonlinearity of the amplifier. Different methods of approximation are then used to obtain a predistorter that at least increases linearity, even if it can not achieve a completely linear system.

Figure 4:
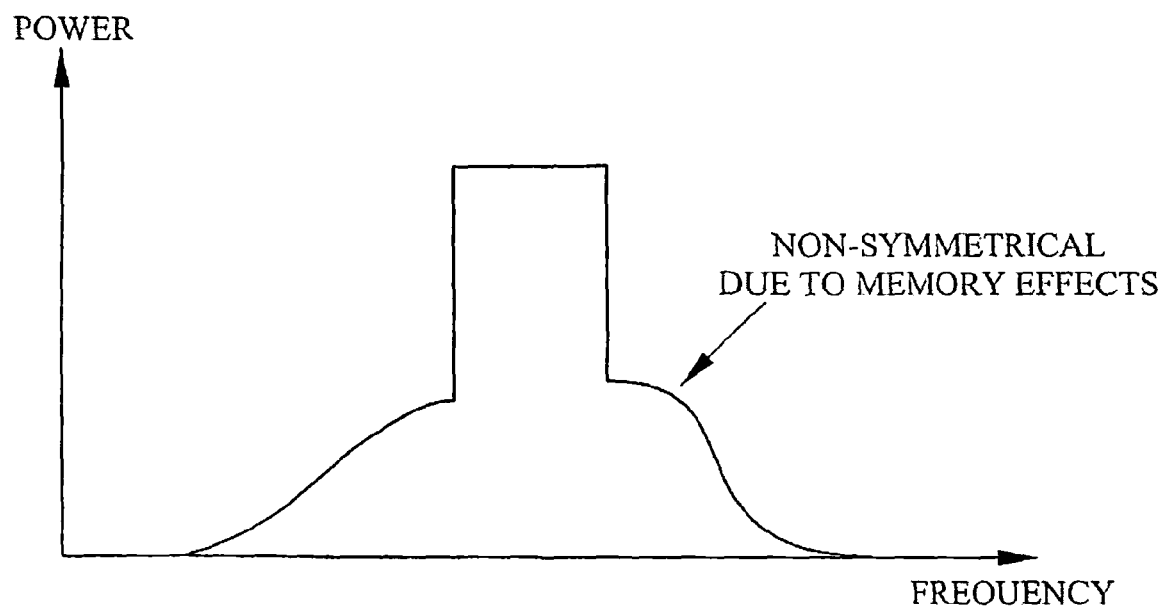
FIG. 4 is a schematic diagram illustrating the spectrum of the signal amplified by a power amplifier with memory.

Memory effects are another problem related to power amplifiers that can no longer be ignored. Moreover, higher power amplifiers such as those used in wireless base stations exhibit memory effects. Memory effects typically results in a non-symmetrical spectrum around the carrier at the output of a power amplifier, as illustrated in FIG. 4. That is, although the carrier (desired signal) spectrum is perfectly symmetrical, the spurious spectrum coming from the distortion may be non-symmetrical with respect to the center of the carrier.

Figure 5:
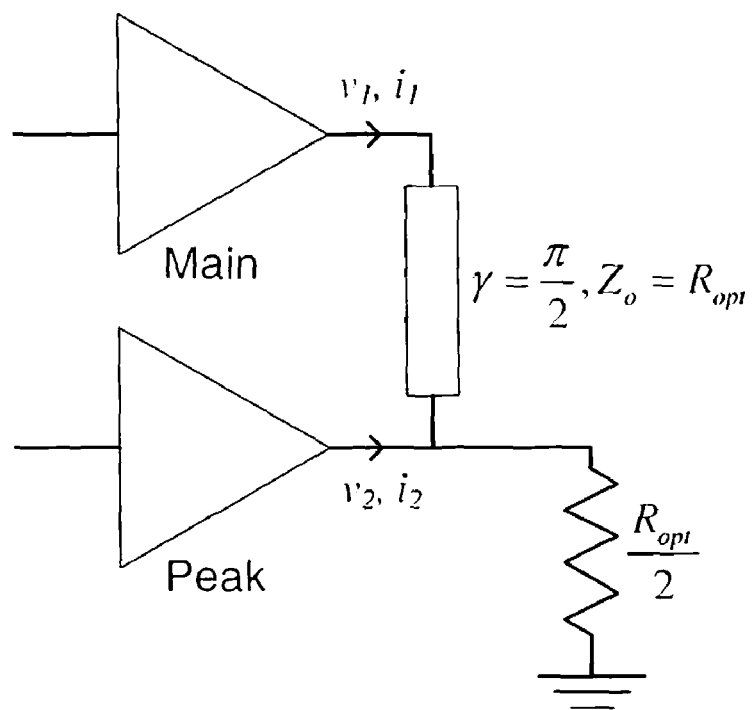
FIG. 5 is a schematic diagram illustrating the principles of a Doherty amplifier.

As mentioned earlier, highly efficient power amplifiers are more sensitive to memory effects especially for RF power amplifiers with large fundamental drain voltages, such as the Doherty amplifier. FIG. 5 illustrates schematically the principles of a Doherty amplifier.

A Doherty amplifier consists of two amplifiers called the main amplifier and the peak amplifier. The main and peak amplifiers are illustrated as equally large, even though they do not have to be of equal size. As illustrated in FIG. 5, the two amplifiers are connected by a quarter-wave transmission line with characteristic impedance $Z_0$. The output of the peak amplifier is additionally connected to a load as shown in FIG. 5. It is here assumed that both amplifiers act as ideal controlled generators, i.e. the output currents ($i_1$ and $i_2$) are proportional to an input drive signal. If we now assume that the optimal load resistance of one of the amplifiers is $R_{opt}$, then, the load resistance should equal $R_{opt}/2$, so that the maximum deliverable power is twice that of a single amplifier. The role of the transmission line is to transform the load resistance to $2R_{opt}$ at the output of the main amplifier. If we assume that the output impedance of the main amplifier is infinite, the impedance seen by the peak amplifier will be zero due to the impedance inverting characteristics of the transmission line.

Figure 6:
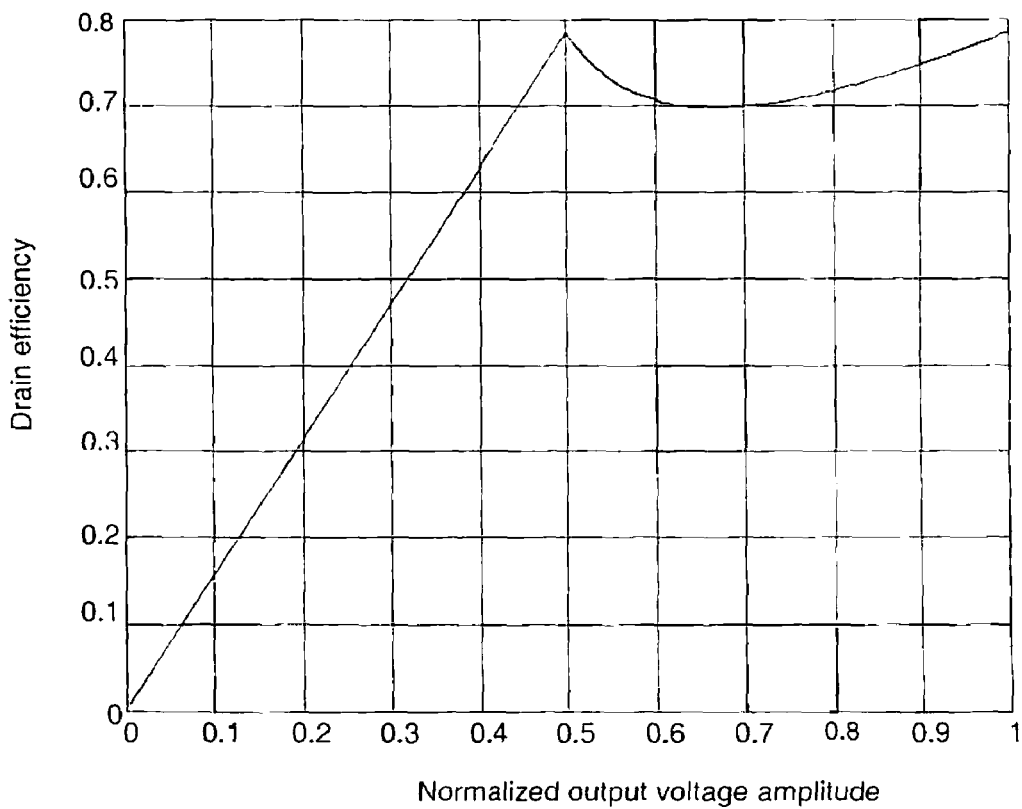
FIG. 6 is a schematic diagram illustrating the efficiency of a Doherty amplifier.

At a low output level, the peak amplifier is completely turned off and presents infinite output impedance. This means that the RF voltage on the main amplifier ($v_1$) rises twice as fast when we increase the current ($i_1$) as for a conventional amplifier (the load resistance is $2R_{opt}$ as compared to $R_{opt}$), giving about twice the efficiency. At some point, called the transition point, this voltage has reached its maximum, with a corresponding maximum in efficiency. When saturation is reached, the Doherty amplifier starts driving current from the peak amplifier, which is transformed through the transmission line to a voltage on the main amplifier. By selecting the phase of $i_2$ to lag 90 degrees behind that of $i_1$, the voltage contribution to $v_1$ from the peak amplifier will be 180 degrees out of phase from the contribution from the main amplifier. This means that the voltage $v_1$ remains constant as we gradually increase $i_1$ and $i_2$. Since the load resistance seen by the peak amplifier is zero, the voltage $v_2$ is not affected by $i_2$, but will instead equal $R_{opt}i_1$. The resulting efficiency of a Doherty amplifier is illustrated in FIG. 6.

Usually an amplifier becomes more sensitive to drain voltage variations when the RF drain voltage is close to saturation which for a conventional amplifier only happens at peak powers, but for a Doherty amplifier, the main amplifier voltage reaches saturation already at the transition point. In other words, the suggested solution of the present invention is particularly suitable for reducing the effects of variations in the drain voltages for a Doherty amplifier and a conventional amplifier. The invention is also particularly suitable for all other types of power amplifiers that operates with high RF voltages at backoff, such as a Chierex amplifier. A Chireix amplifier is described in H. Chireix, "High power outphasing modulation", *Proc. IRE*. vol. 23. no. 2, pp. 1370-1392. November 1935.

In order to achieve the desired results using a predistortion technique and a predistorter, it is of crucial importance to understand the behaviour of an amplifier very accurately so that determination of the input signal will generate the correct and desired output signal. It is thus important to know what output signal is generated by a particular input signal, i.e. it is important to determine a model of the power amplifier. Only by knowing this it is possible to determine what input signal should be given to the power amplifier (PA) to generate the particular wanted output signal. In other words, the goal here is to find a good model to approximate the inverse of the power amplifier, in the sense that parameter extraction and system implementation are straightforward and the predistorter in accordance with present invention is robust making the power amplifier such as a Doherty, a Chierex or a conventional amplifier much more efficient.

Figure 7:
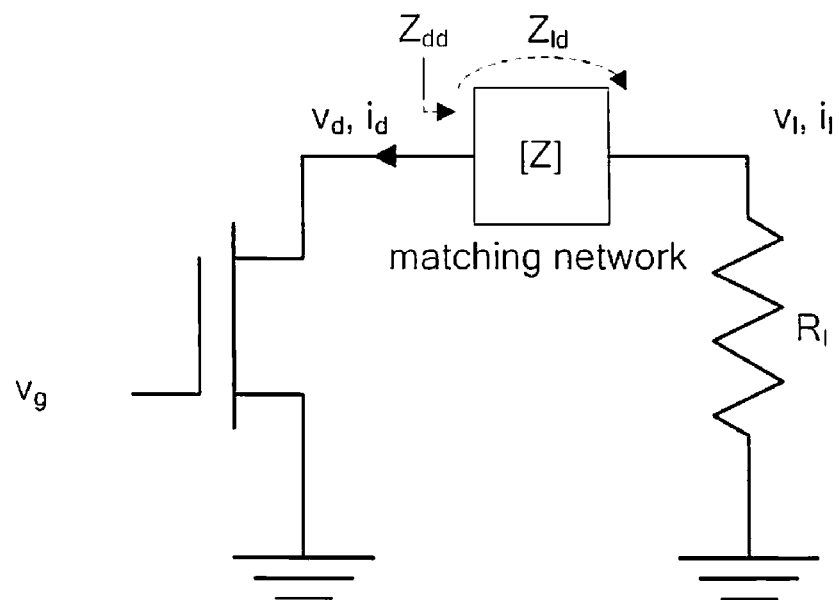
FIG. 7 is a schematic representation of a simplified conventional power amplifier.

The embodiments of the invention will now be described based on a conventional amplifier as illustrated in FIG. 7, although, any other type of amplifiers comprising a transistor/transistors could be used. Furthermore, the present invention will only focus on memory effects generated by fundamental frequency effects, not baseband or harmonics, although, the resulting predistorter can to some extent compensate for effects due to these frequencies as well.

FIG. 7 illustrates a schematic view of a conventional amplifier comprising a transistor which input voltage is $v_g$: a matching network [Z] supplied with a drain voltage $v_d$ and a drain current $i_d$. The amplifier is also composed of a load represented by $R_l$, which usually represents an antenna in a base station of a communication system.

As explained earlier, drain voltage variations occur because a load matching network [Z] of an amplifier used to transform the load impedance of the amplifier is composed of reactive components, making the matching network frequency dependent.

As a result, the drain voltage $v_d$ over the load matching network [Z] becomes frequency dependent which leads to variations in the drain voltage $v_d$. Furthermore, because a transistor gain is very sensitive to variations in the drain voltage, a drain current $i_d$ also becomes frequency dependent.

A model of the power amplifier as illustrated in FIG. 7 will now be derived, which model is further used to derive an expression of the inverse behaviour of the amplifier. Using this derived expression, a predistorter according to the present invention capable of reducing frequency memory effects in the RF power amplifier is determined.

If we assume that the only source of memory effects is the load matching network [Z] (or drain filter), the model of the power amplifier can then be given by the following equations:

$$i_d[n] = f(v_g[n], v_d[n]) \qquad (1)$$

$$v_d[n] = \sum_{m=0}^{\infty} Z_{dd}[m] \cdot i_d[n-m] \qquad (2)$$

$$v_l[n] = \sum_{m=0}^{\infty} Z_{ld}[m] \cdot i_d[n-m] \qquad (3)$$

where, $i_d[n]$ in equation (1) represents the drain current of the amplifier: $v_g[n]$ represents the drain voltage and $v_d[n]$ is the drain voltage of the amplifier. It is here assumed that all signals are sampled, since the implementation will probably be digital in most cases. However, a person skilled in the art appreciates that the implementation could be analogue.

According to equation (1), the drain current $i_d[n]$ is represented as a nonlinear function of the gate voltage $v_g[n]$ and the drain voltage $v_{d[n]}$.

The drain voltage $v_d[n]$ and the output voltage $v_1[n]$ of the power amplifier are further given by the matching network and the drain current according to equations (2) and (3) respectively. This matching network is assumed to be substantially linear, i.e. it is assumed to comprise mostly linear components (such as transmission lines, capacitors and inductances). The matching network [Z] is here characterized by the impulse responses $Z_{dd}$ and $Z_{ld}$ as illustrated in FIG. 7. $Z_{dd}$ represents the frequency dependent impedance of both the load $R_l$ and the matching network [Z] as seen from the transistor drain and $Z_{ld}$ represents the trans-impedance (also frequency dependant) from the transistor drain to the output node. The term transistor drain is here used to mean the package internal drain connection to the die, not the package external connection point.

If we assume that the changes in drain voltage $v_d[n]$ introduced by the memory (or frequency dependence) in the matching network are small, which is usually the case since the amplifier is constructed to have a substantially flat frequency response, a complex series expansion of the drain current function $i_d[n]$ can be developed. For sufficiently small memory or similarly small variations, all terms with higher order in $\delta_v[n]$ than one can be neglected. It should be noted that it is possible to use higher order approximation as will be described later.

The drain current $i_d[n]$ can thus be rewritten according to equation (4) below $$i_d[n] \approx v_g[n] \cdot g_0(|v_g[n]|) + \delta_v[n] \cdot g_1(|v_g[n]|) + \delta_v^*[n] \cdot v_g^2[n] \cdot g_2(|v_g[n]|) \quad (4)$$

where, functions $g_0(|v_g[n]|)$, $g_1(|v_g[n]|)$ and $g_2(|v_g[n]|)$ represent the trans-conductances or gain functions of the power amplifier and $\delta_v[n]$ represents the small variations in the drain voltage around some bias point. This bias point or linearization point can for example be selected to be the drain voltage resulting from the k-th delayed tap of the drain matching filter, although any other suitable bias point or linearization point could be used. The drain voltage variations is given according to equation (5) below $$\delta_v[n] = v_d[n] - Z_{dd}[k] \cdot i_d[n] \quad (5)$$

$$= \sum_{m \neq k} Z_{dd}[m] \cdot i_d[n-m]$$

As can be noted from equation (5) above, the bias point or linearization point has been chosen as suggested above.

Using (3), (4) and (5), a recursive (i.e. each $i_d$ depends on the current gate voltage $v_g$ and the previous drain current $i_d$) definition of the PA model is given, which in accordance with the present invention models memory effects caused by drain voltage variations. By further truncating this recursion, we can obtain yet another approximation of the drain current function $i_d[n]$ according to equation (6) below $$i_d[n] \approx \quad (6)$$
$$v_g[n-k] \cdot \tilde{g}_0(|v_g[n-k]|) + \left( \sum_{m \neq k} Z_{dd}[m] \cdot v_g[n-m] \right) \cdot \tilde{g}_1(|v_g[n-k]|) ++ $$
$$\left( \sum_{m \neq k} Z_{dd}[m] \cdot v_g[n-m] \right)^* \cdot v_g^2[n-k] \cdot \tilde{g}_2(|v_g[n-k]|)$$

The derived PA model can further be generalized by replacing the product of the filter coefficient $Z_{dd}$ and the $\tilde{g}_i$ functions where i=0,1,2 with nonlinear FIR filters represented by $\hat{g}_{1m}(|v_g[n-k]|)$ and $\hat{g}_{2m}(|v_g[n-k]|)$ in equation (7) below $$i_d[n] \approx v_g[n-k] \cdot \tilde{g}_0(|v_g[n-k]|) + \sum_{m \neq k} v_g[n-m] \cdot \hat{g}_{1m}(|v_g[n-k]|) ++ \quad (7)$$
$$\sum_{m \neq k} v_g^*[n-m] \cdot v_g^2[n-k] \cdot \hat{g}_{2m}(|v_g[n-k]|)$$

It should be noted that the generalized expression of the drain current function $i_d[n]$ given by equation (7) has the advantage of being linear in the g-functions $\tilde{g}_0(|v_g[n-k]|)$, $\hat{g}_{1m}(|v_g[n-k]|)$ and $\hat{g}_{2m}(|v_g[n-k]|)$, making it easier to adapt.

Figure 8:
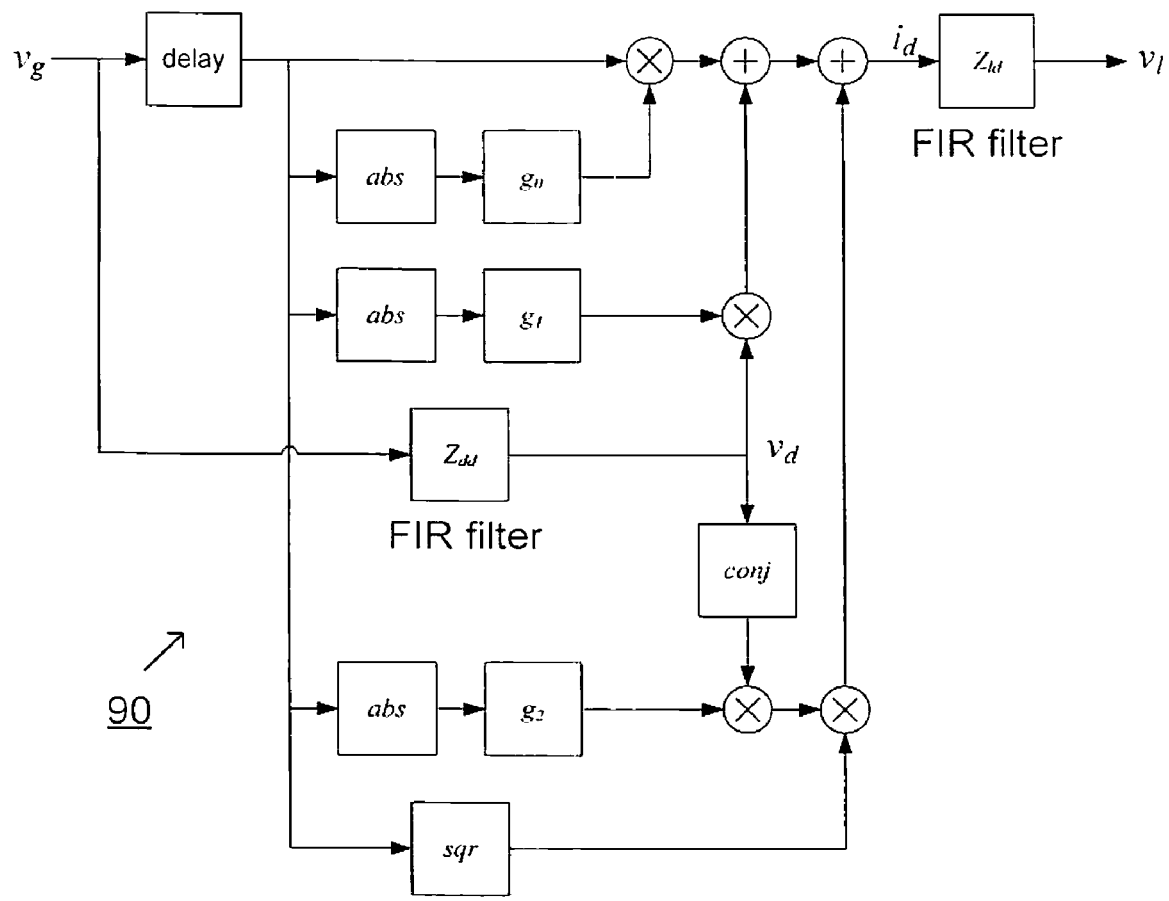
FIG. 8 is a schematic block diagram of an exemplary embodiment of a model of a power amplifier used to derive a predistorter according to the present invention.

A schematic representation of an embodiment of a PA model 90 based on equation (6) is illustrated in FIG. 8. As can be seen from FIG. 8, a delay block has been introduced to compensate for bulk delay in $Z_{dd}$. This is similar as selecting a different bias point, namely the drain current resulting from the correspondingly delayed tap, $Z_{dd}[k]$, which can be advantageous if the initial tap of $Z_{dd}$ is small.

It is also clear from FIG. 8 that the input to the power amplifier is $v_g$, which is the gain voltage. Using $v_g$ as an input to the power amplifier, a desired drain current $i_d$ is obtained using equation (6).

Thus, the goal of a predistorter in accordance with the present invention is to determine which input should the power amplifier have when an input to the predistorter according to the present invention is known.

Let us first assume that x is a known input to the predistorter according to the present invention, and that x provides a good estimate of the PA output voltage if the predistorter converges. Using the same procedures as for the PA model, an estimate of the drain current function $i_d[n]$, denoted $\hat{i}_d[n]$, can be derived using the inverse of the filter given by equation (3):

$$\hat{i}_d[n] = \sum_{m=0}^{\infty} \hat{Z}_{ld}[m] \cdot x[n-m] \quad (8)$$

Next, an estimate of the drain voltage variations $\delta_v[n]$, denoted $\hat{\delta}_v[n]$, is determined by using equation (5) and an estimate of the drain current function $\hat{i}_g[n]$ as given by equation (9) below:

$$\hat{\delta}_v[n] = \sum_{m \neq k} Z_{dd}[m] \cdot \hat{i}_d[n-m] \quad (9)$$

Using equations (8) and (9), a series expansion of the gate voltage function $v_g[n]$ similar to the series expansion introduced earlier in equation (4) gives us the following expression that defines a predistorter in accordance with a first embodiment of the present invention:

$$v_g[n] \approx \hat{i}_d[n-k] \cdot f_0(|\hat{i}_d[n-k]|) + \hat{\delta}_v[n] \cdot f_1(|\hat{i}_d[n-k]|) + \hat{\delta}_v^*[n] \cdot \hat{i}_d^2[n-k] \cdot f_2(|\hat{i}_d[n-k]|) \quad (10)$$

The function $f_0(|\hat{i}_d[n-k]|)$ in equation (10) represents the memoryless behaviour of the amplifier, i.e. it's output is the memoryless large-signal gain of the predistorter, and $\hat{i}_d[n-k]$ represents a selected time-delayed version of the estimate of the drain current $\hat{i}_d$. The functions $f_1(|\hat{i}_d[n-k]|)$ and $f_2(|\hat{i}_d[n-k]|)$ describes the amplifiers sensitivity to fluctuations in the drain voltage for different output amplitudes.

Note that when designing a predistorter according to equation (10), the functions $f_0(|\hat{i}_d[n]|)$, $f_1(|\hat{i}_d[n]|)$, $f_2(|\hat{i}_d[n]|)$ and the filter $Z_{dd}$ should preferably be chosen or adapted in such a way as to optimize the quality of the power amplifier output when its input is the predistorter output.

Similar to the PA model defined in equation (6), the predistorter given by expression (10) can further be generalized by replacing the product of the filter $Z_{dd}$ and functions $f_1(|\hat{i}_d[n-k]|)$ and $f_2(|\hat{i}_d[n-k]|)$ by nonlinear FIR filters, which leads to the following expression of the gate voltage function:

$$v_g[n] \approx \hat{i}_d[n-k] \cdot f_0(|\hat{i}_d[n-k]|) + \sum_{m \neq k} \hat{i}_d[n-m] \cdot h_{1m}(|\hat{i}_d[n-k]|) + + \sum_{m \neq k} \hat{i}_d^*[n-m] \cdot \hat{i}_d^2[n-k] \cdot h_{2m}(|\hat{i}_d[n-k]|) \quad (11)$$

where $f_0(|\hat{i}_d[n-k]|)$ again describes the memoryless behaviour of the predistorter (c.f. $f_0$ in equation (10)), and $h_{1m}(|\hat{i}_d[n-k]|)$ and $h_{2m}(|\hat{i}_d[n-k]|)$ represent the sensitivity of the power amplifier and are functions of $|\hat{i}_d[n-k]|$, which is the amplitude of the selected time-delayed version of the estimate of the drain current $\hat{i}_d$. Note that the functions $f_1$ and $f_2$ given above in equation (10) have been replaced by several functions $h_{1m}$ and $h_{2m}$ respectively, one for each tap of $Z_{dd}$.

The gate voltage function $v_g[n]$ given by equation (11) defines the output of the predistorter according to a second embodiment of the present invention. This gate voltage is also the desired input to the power amplifier PA according to equation (6) or equation (7).

Note that the generalized expression of the gate voltage $v_g[n]$ as given by equation (11) has the advantage of being linear in $f_0(|\hat{i}_d[n-k]|)$, $h_{1m}(|\hat{i}_d[n-k]|)$, and $h_{2m}(|\hat{i}_d[n-k]|)$, making the predistorter according to the invention much easier to adapt. Also, because $f_0(\hat{i}_d[n-k]|)$, $h_{1m}(|\hat{i}_d[n-k]|)$, and $h_{2m}(|\hat{i}_d[n-k]|)$ are implemented using nonlinear filters, the predistorter according to the invention is fairly simple to implement and does not require complex calculations to be performed.

As mentioned earlier, it is not necessary to stop the series expansion after the first order, higher order terms can be included as well. Equation (12) below represents an expression of the gain voltage or similarly the predistorter that includes second order terms:

$$v_g[n] \approx \hat{i}_d[n] \cdot f_0(|\hat{i}_d[n]|) + \hat{\delta}_v[n] \cdot f_1(|\hat{i}_d[n]|) + \\ \hat{\delta}_v^*[n] \cdot \hat{i}_d^2[n] \cdot f_2(|\hat{i}_d[n]|) + + \\ \hat{\delta}_v^2[n] \cdot \hat{i}_d^*[n] \cdot f_3(|\hat{i}_d[n]|) + | \\ \hat{\delta}_v[n]|^2 \cdot \hat{i}_d[n] \cdot f_4(|\hat{i}_d[n]|) + ( \\ \hat{\delta}_v^*[n])^2 \cdot \hat{i}_d^3[n] \cdot f_5(|\hat{i}_d[n]|)) \quad (12)$$

A similar generalisation as in equation (11) can also be derived for this predistorter as well, but is not included here.

Figure 9:
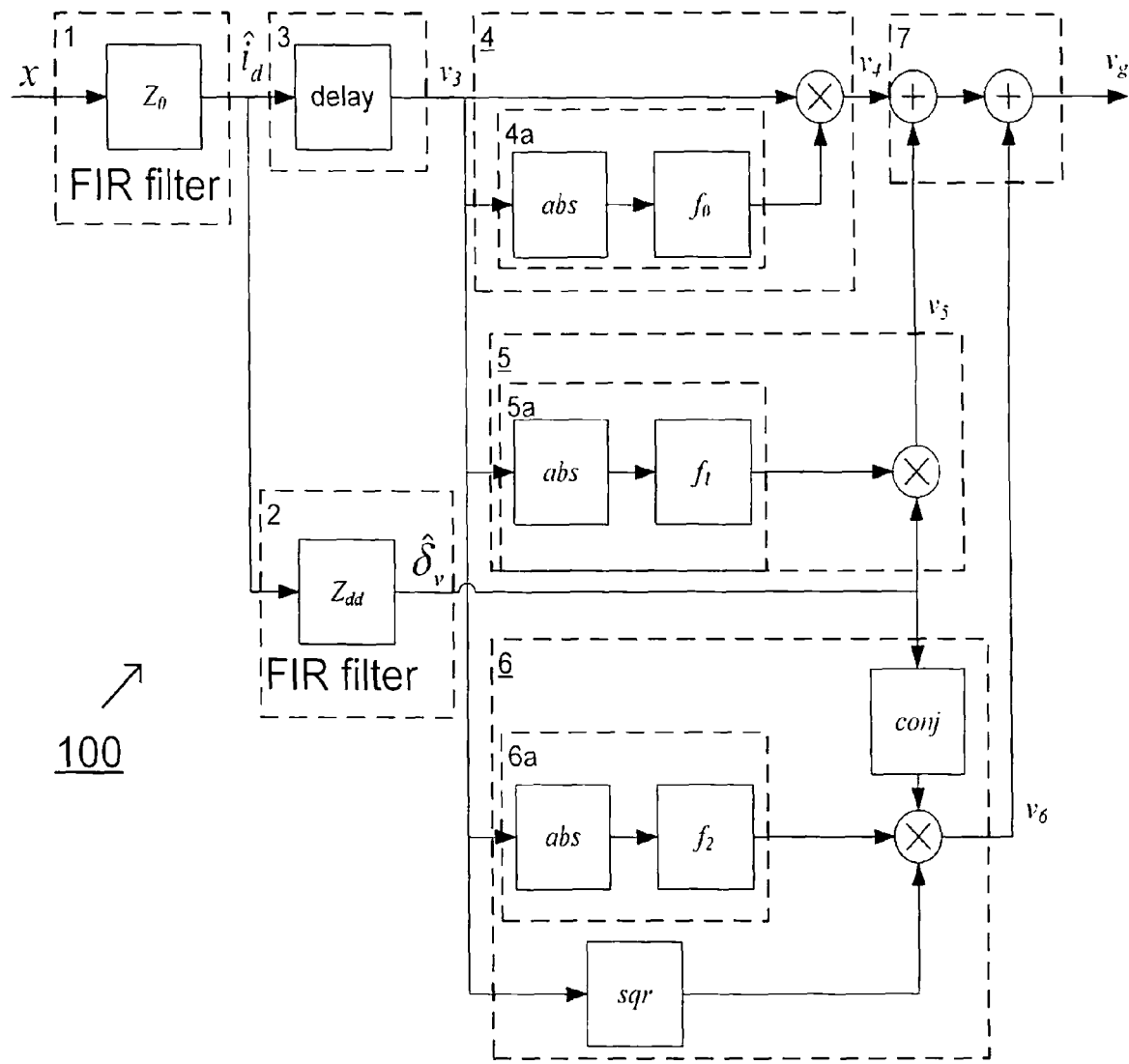
FIG. 9 is schematic block diagram of a first embodiment of a predistorter according to the present invention.

FIG. 9 illustrates a predistorter 100 according to a first embodiment of the invention. This predistorter is based on equations (8), (9) and (10). All signal names correspond to those signals given by these equations. The predistorter in FIG. 9 comprises a first functional block 1 for generating an estimate $\hat{i}_d$ of the drain current $i_d$ using in this case a first linear FIR filter $Z_0$; a second functional block 2 to generate an estimate $\hat{\delta}_v$ of the drain voltage variations $\delta_v$, also by using in this case a linear FIR filter $Z_{dd}$; a third functional block 3 generating a signal $v_3$ for compensating for delay in $Z_{dd}$ corresponding to the delay k in equation (10) and which signal $v_3$ is a function of the amplitude of a selected time-delayed version of $\hat{i}_d$; a fourth functional block 4 for generating a signal $v_4$ as a function of the signal $v_3$ and a gain (or sensitivity) function $f_0$ representing the memoryless behaviour of the amplifier; a fifth functional block 5 to generate a signal $v_5$ is a function of both the drain voltage variations $\hat{\delta}_v$ and a gain function $f_1$ representing the sensitivity of the power amplifier and being in itself a function of the signal $v_3$; a sixth functional block 6 to generate a signal $v_6$ as a function of the conjugate of the drain voltage variations $\hat{\delta}_v$, the square of the signal $v_3$ and a gain function $f_2$ representing the sensitivity of the power amplifier and being in itself a function of the signal $v_3$; and a seventh functional block 7 to combine the output signals $v_4$, $v_5$, and $v_6$ from the functional blocks 4, 5 and 6 respectively in order to generate the desired output gain voltage $v_g$ when the input signal to the predistorter is x. The output voltage signal is further transmitted as an input to an amplifier in order to reduce memory effects in accordance with the present invention.

Using equation (10), the output signal $v_g$ can be divided into three signal components represented in FIG. 9 by the signals $v_4$, $v_5$, and $v_6$ respectively, where $v_4 = \hat{i}_d[n-k] \cdot f_0(|\hat{i}_d[n-k]|)$ is the output from the functional block 4;

$v_5 = \hat{\delta}_v[n] \cdot f_1(|\hat{i}_d[n-k]|)$ is the output from the functional block 5, and $v_6 = \hat{\delta}_v^*[n] \cdot \hat{i}_d^2[n-k] \cdot f_2(|\hat{i}_d[n-k]|)$ is the output from the functional block 6 or similarly.

$$v_4 = v_3 f_0(|v_3|)$$

$$v_5 \hat{\delta}_v[n] \cdot f_1(|v_3|)$$

$$v_6 = \hat{\delta}_v^*[n] \cdot v_3^2 \cdot f_2(|v_3|)$$

where, $v_3 = \hat{i}_d[n-k]$

Thus, the output signal $v_g$ from the functional block 7 is given by:

$$v_g \approx v_4 + v_5 + v_6$$

$v_4$, $v_5$, $v_6$ of equation 10 are also defined here as, the zero-th order term; the first order term; and the conjugate first order term respectively.

Note that functions $f_{i,i=0,1,2}(|\hat{i}_d[n-k]|)$ represented in FIG. 9 in the functional blocks 4, 5 and 6 can easily be implemented using look-up tables LUTs (with or without interpolation); expanded using polynomials or by any other suitable means.

In many cases, the linear distortion of the output signal of an amplifier is sufficiently small to begin with, and does not have to be compensated. In such case, the FIR filter $Z_0$ can be omitted from the implementation. Also, it can sometimes be enough to include first order term $\hat{\delta}_v[n] \cdot f_1(|\hat{i}_d[n-k]|)$, neglecting the conjugate term $\hat{\delta}_v^*[n] \cdot \hat{i}_d^2[n-k] \cdot f_2(|\hat{i}_d[n-k]|)$ (equivalent to setting $f_2 = 0$).

Figure 10:
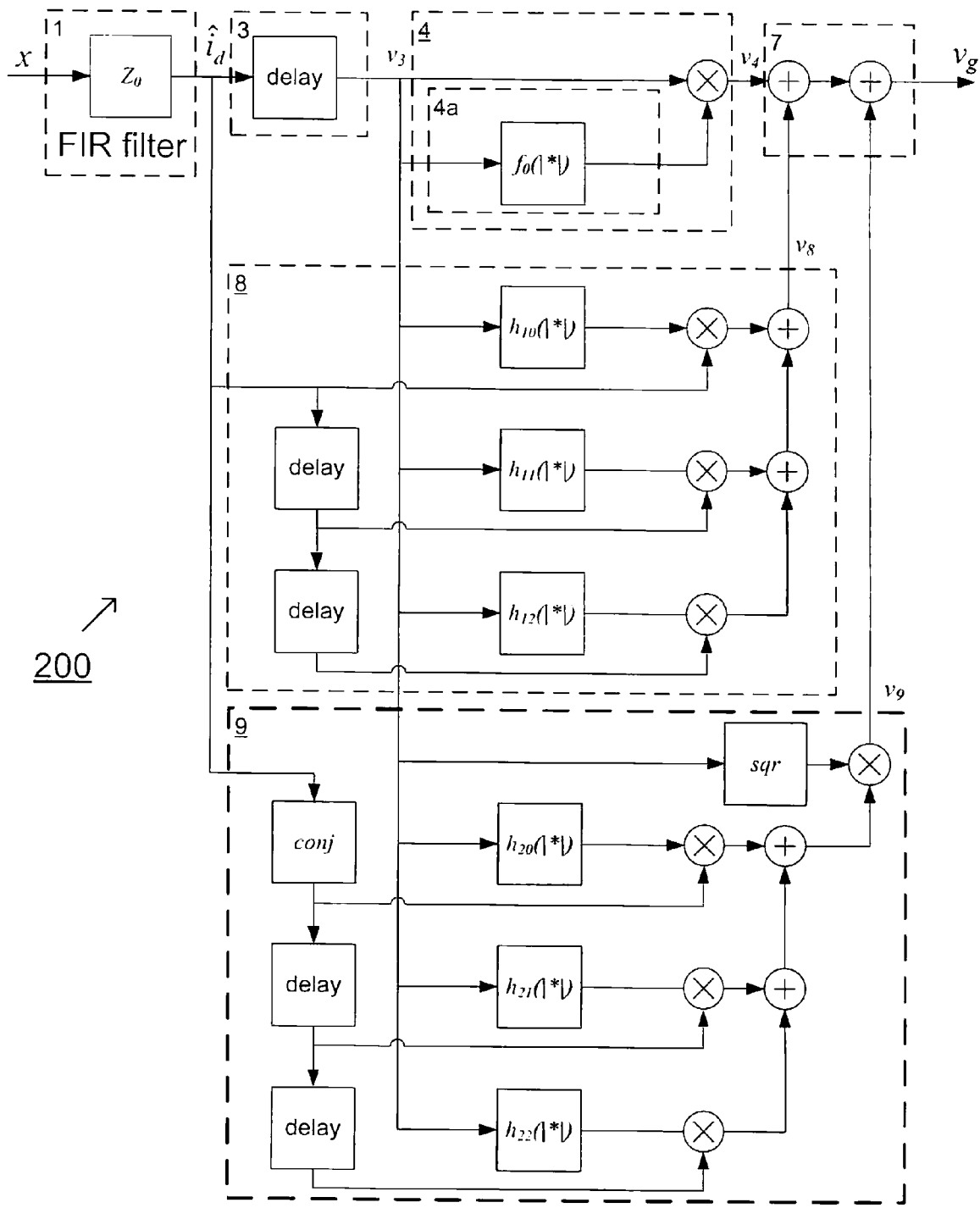
FIG. 10 is a schematic block diagram of a second embodiment of a predistorter according to the present invention.

FIG. 10 illustrates a predistorter 200 according to a second embodiment of the present invention. This predistorter 200 is based on equation (8) and equation (11) which is a generalisation of predistorter 100 given by equation (10). All signal components correspond to those signals given by equation (8) and equation (11).

As depicted in FIG. 10, the predistorter 200 according to this second embodiment includes a first functional block 1 for generating an estimate $\hat{i}_d$ of the drain current $i_d$, which corresponds to the first functional block 1 of the predistorter 100 in FIG. 9. The predistorter 200 further includes a functional block 8 for generating a signal $v_8$ as a function of the estimate $\hat{i}_d$ of the drain current and gain functions $h_{10}$, $h_{11}$, $h_{12}$, which represent the sensitivity of the power amplifier and depend on the amplitude of a selected time-delayed version $v_3$ of the estimate $\hat{i}_d$. A further functional block 9 of the predistorter 200 is arranged to generate a signal $v_9$ as a function of a conjugate of the estimate $\hat{i}_d$, and gain functions $h_{20}$, $h_{21}$, $h_{22}$, which represent the sensitivity of the power amplifier and depend on the amplitude of the selected time-delayed version $v_3$ of the estimate $\hat{i}_d$. The predistorter 200 also comprises a functional block 7, corresponding to the functional block 7 of the predistorter 100, for combining the signals $v_8$ and $v_9$ to form the output signal $v_g$.

Using equation (11), the output signal $v_g$ can also here be divided into three signal components represented in FIG. 10 by signals $v_4$, $v_8$ and $v_9$ respectively, where
$v_4 = \hat{i}_d[n] \cdot f_0(|\hat{i}_d[n-k]|)$ is the output from the functional block 4 (similar for both FIG. 9 and FIG. 10):

$$v_8 = \sum_{m \neq k} \hat{i}_d[n-m] \cdot h_{1m}(|\hat{i}_d[n-k]|).$$

is the output from the functional block 8; and $$v_9 = \sum_{m \neq k} \hat{i}_d^*[n-m] \cdot \hat{i}_d^2[n-k] \cdot h_{2m}(|\hat{i}_d[n-k]|)$$

is the output from the functional block 9, or similarly.

$$v_4 = v_3 f_0(|v_3|)$$
$$v_8 = \sum_{m \neq k} \hat{i}_d[n-m] \cdot h_{1m}(|v_3|)$$
$$v_9 = \sum_{m \neq k} \hat{i}_d^*[n-m] \cdot v_3^2 \cdot h_{2m}(|v_3|)$$

where again, $v_3 = \hat{i}_d[n-k]$

Thus, the output signal $v_g$ is given by:

$$v_g \approx v_4 + v_8 + v_9$$

The predistorter 200 of FIG. 10 differs from the predistorter 100 of FIG. 9 in the following:

The functional block 2 and the functional block 5 in FIG. 9 have been combined into a nonlinear FIR filter represented by the functional block 8 in FIG. 10.

The functional block 2 and the functional block 6 in FIG. 9 have been combined into a nonlinear FIR filter represented by the functional block 9 in FIG. 10.

These combinations may easily be implemented if the functional block 2 of FIG. 9, which is used to generate the estimate of drain voltage variations given by equation (9), is realized with only a few filter coefficients, and if each of these filter coefficients (constant) is replaced with the output from a function.

As illustrated in FIG. 10, the functional blocks 8 and 9 include only a few taps, which is a further advantage of this embodiment of the invention since relatively few number of taps are easier both to implement and to adapt.

Thus, when implementing a predistorter in accordance with the present invention a trade-off between efficiency and complexity must be taken into consideration when choosing the number of taps. However, a person skilled in the art appreciates that any number of taps could be used.

Finally, explicit absolute abs value block in FIG. 9 have been embedded in function blocks $f_0$ and $h_{xx}$.

Normally, no tap in functional block 2 of FIG. 9, and functional blocks 8 or 9 of FIG. 10 are selected to have the same total delay as functional block 3. This is shown in the equations above as well wherein the sums of equations (9), (10), and (11) delay m is selected to be different from a selected delay k (i.e. m≠k). On the other hand, if extra redundancy is not a concern this restriction could be ignored.

Figure 11:
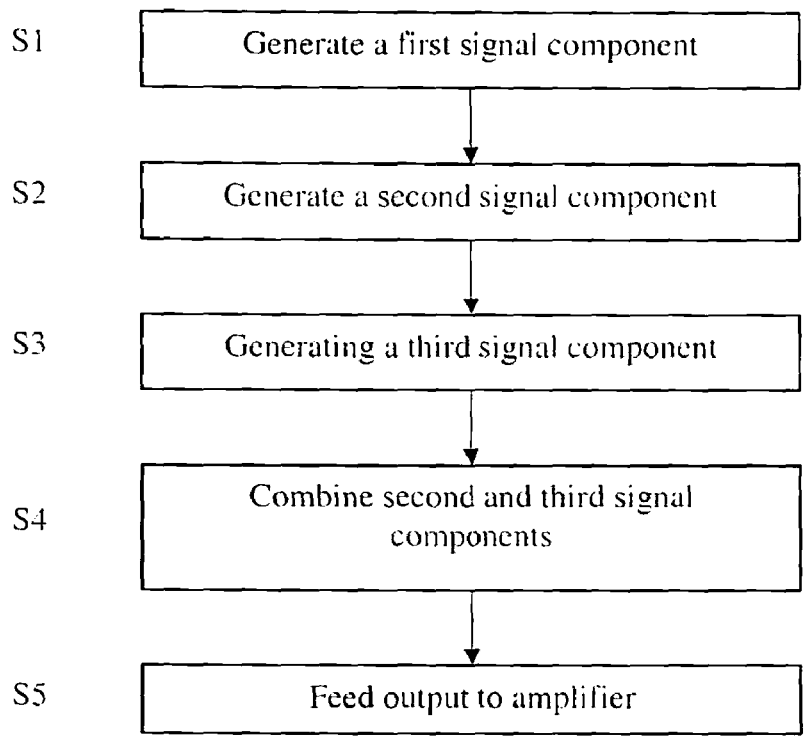
FIG. 11 is a flow chart of a method according to the present invention.

FIG. 11 illustrates a method for reducing the memory effects in a RF power amplifier using a predistorter having an input signal x and an output signal $v_g$ according to the second aspect of the invention.

At step S1, a first signal component $\hat{i}_d$ is generated by estimating a drain current of the amplifier using a linear filter.

At step S2, a second signal component $v_8$ is generated as a function of the first signal component $\hat{i}_d$ and at least one first gain function $h_{10}$, $h_{11}$, $h_{12}$, $f_1$, which at least one first gain function $h_{10}$, $h_{11}$, $h_{12}$, $f_1$ represents the sensitivity of the power amplifier and is a function of the amplitude of a selected time-delayed version $v_3$ of said first signal component $\hat{i}_d$.

At step S3, a third signal component $v_9$ is generated as a function of a conjugate of the first signal component $\hat{i}_d$ and at least one second gain function $h_{20}$, $h_{21}$, $h_{22}$, $f_2$, which at least one second gain function $h_{20}$, $h_{21}$, $h_{22}$, 71 $_2$ represents the sensitivity of the power amplifier and is a function of the amplitude of the selected time-delayed version $v_3$ of said first signal component $\hat{i}_d$.

Finally, at step S5, an output signal $v_g$ is generated and fed to the amplifier by combining at step S4 at least the second signal component $v_8$ and the third signal component $v_9$.

Figure 12:
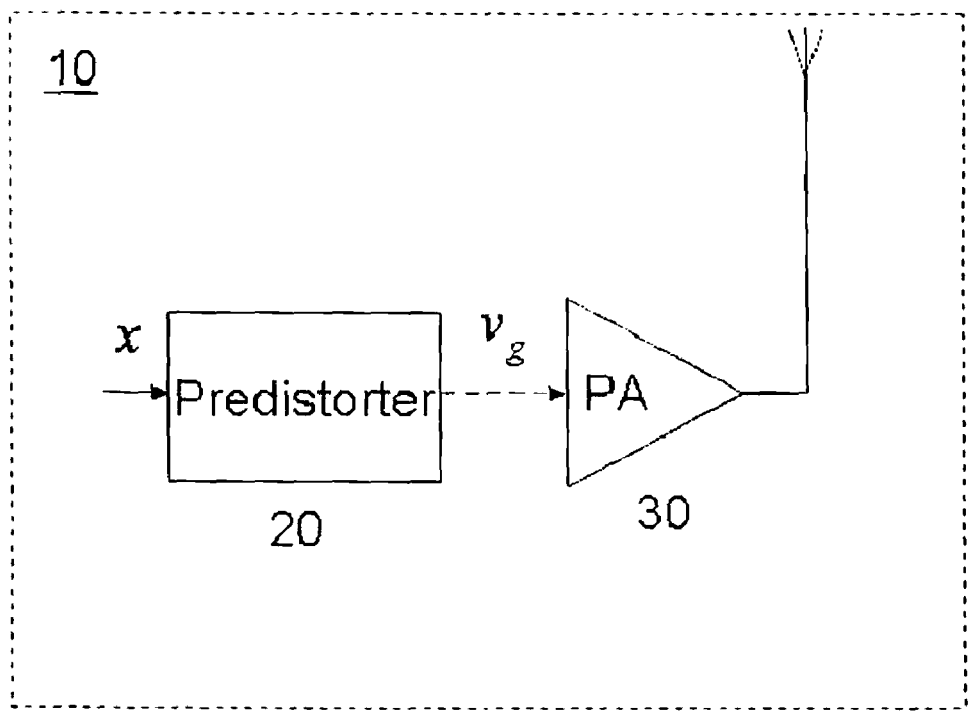
FIG. 12 is a schematic block diagram of an exemplary embodiment of a base station including a power amplifier provided with a predistorter according to the present invention.

FIG. 12 is a schematic block diagram of a third aspect of the invention wherein a base station 10 including a power amplifier provided with a predistorter in accordance with the present invention is illustrated. In FIG. 12 elements that are not necessary for understanding the invention have been omitted, such as for instance modulators and D/A converters, and other base station components. According to FIG. 12, an input signal x is forwarded to a predistorter 20 in accordance with the present invention. The predistorter output signal $v_g$ is further forwarded to a power amplifier 30, and the amplified signal is fed to an antenna. Predistorting the input signal x effectively reduces frequency memory effects in the power amplifier in accordance with the present invention.

Figure 13:
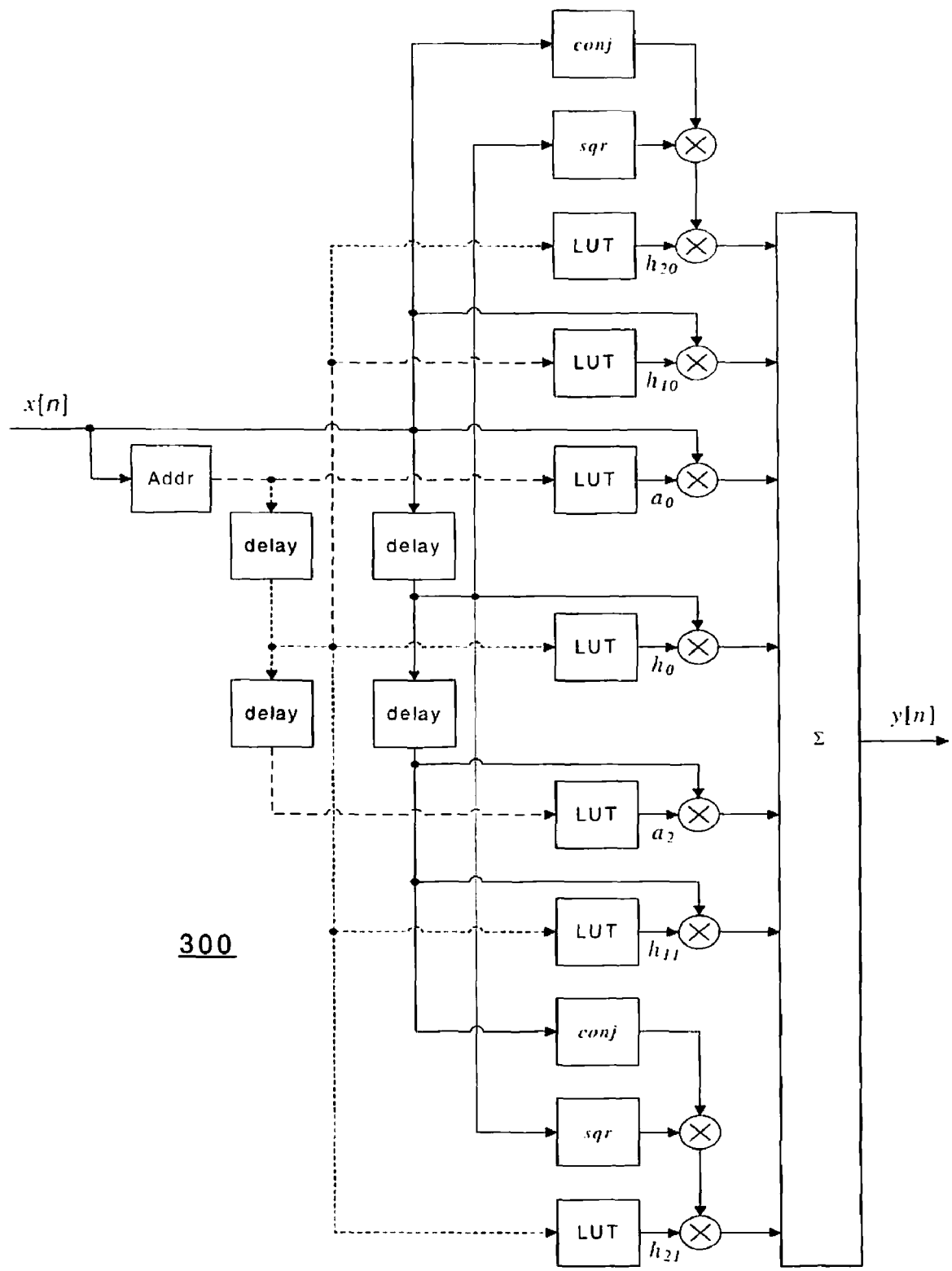
FIG. 13 is a schematic block diagram of an exemplary embodiment of a combination of a predistorter according to the present invention with a prior art predistorter.

As mentioned above, a predistorter in accordance with any described embodiment of the present invention has the advantage that it can easily be combined with other prior art predistorters. FIG. 13 illustrates such a combination 300, where a predistorter in accordance with the embodiment of the present invention as shown in FIG. 10 is combined with a prior art predistorter as described in the international patent application WO 2004/086607. As depicted in FIG. 13, the FIR filter $Z_0$ has been omitted. In addition, the gain functions $h_{10}(|*|)$, $h_{11}(|*|)$, $h_{12}(|*|)$, $h_{20}(|*|)$, $h_{21}(|*|)$, $h_{22}(|*|)$ of FIG.

10 have been replaced by look-up-tables LUTs that take an address as an input. This address is generated in a separate block and is separately delayed. The outputs from LUT tables $h_{10}$, $h_{20}$, $h_{11}$, $h_{21}$ are here directly deduced from the new invention, while functions $\alpha_0$ and $\alpha_2$ are deduced from prior art described in the international patent application WO 2004/086607. Furthermore, the functional delay block 3 in FIG. 9 or in FIG. 10 has been included into the functional blocks 8 and 9 of FIG. 10.

A person skilled in the art appreciates that the predistorter of the present invention can also be adaptive since the property of the amplifier could change over time, i.e. the amplifier's properties might be affected by factors such as ageing or changes in the properties of the amplifier's surroundings and using an adaptive predistorter will prevent any deterioration of the amplifier.

As mentioned earlier, an amplifier becomes more sensitive to drain voltage variations when the RF drain voltage is close to saturation which for a conventional amplifier only happens at peak powers, but for a Doherty amplifier, which has higher efficiency, saturation happens much earlier. This is due to the fact that in a Doherty amplifier, only one drain voltage is close to saturation making the Doherty amplifier more sensitive to frequency memory effects at this drain voltage. Therefore, the predistorter according to the present invention is particularly suitable for reducing the effects of variations in the drain voltages for a Doherty amplifier. However, the person skilled in the art appreciates that the predistorter of the present invention will effectively reduce frequency memory effects in other type of amplifiers.

It is also apparent to a person skilled in the art that the predistorter according to the present invention can be realised in many different ways. This predistorter can be realised in hardware with means of digital circuits or as software in a signal processing circuit.

Furthermore, although the present invention has been described with reference to a FIR filter structure, it is also possible to use the same principles for an IIR (Infinite Impulse Response) filter structure, or a combination of FIR and IIR filter structures. Thus, the most general filter structure in which the invention may be implemented is a discrete time filter structure.

It will be understood by those skilled in the art that various modifications and changes may be made to the present invention without departure from the scope thereof, which is defined by the appended claims.

The invention claimed is:

1. A predistorter 200 for reducing frequency memory effects in a RF power amplifier, which predistorter has a predistorter input signal (x) and an output signal ($v_g$) wherein said predistorter includes first means (1) for generating a first signal component ($\hat{i}_d$), which is an estimate of a drain current of said amplifier, which means (1) for generating said first signal component comprises a linear filter;

second means (8) for generating a second signal component ($v_8$) as a function of said first signal component ($\hat{i}_d$) and at least one first gain function ($h_{10}$, $h_{11}$, $h_{12}$, $f_1$), which at least one first gain function ($h_{10}$, $h_{11}$, $h_{12}$, $f_1$) represents the sensitivity of the power amplifier and is a function of the amplitude of a selected time-delayed version ($v_3$) of said first signal component ($\hat{i}_d$);

third means (9) for generating a third signal component ($v_9$) as a function of a conjugate of said first signal component ($\hat{i}_d$) and at least one second gain function ($h_{20}$, $h_{21}$, $h_{22}$, $f_2$), which at least one second gain function ($h_{20}$, $h_{21}$, $h_{22}$, $f_2$) represents the sensitivity of the power amplifier and is a function of the amplitude of said selected time-delayed version ($v_3$) of said first signal component ($\hat{i}_d$); and fourth means (7) for combining at least said second signal component ($v_8$) and said third signal component ($v_9$) to form said output signal ($v_g$).

2. The predistorter according to claim 1 wherein said second means (8) and said third means (9) include fifth means (2) for generating an estimate of drain voltage variations ($\hat{\delta}_v$) of said amplifier as a function of a filtered linearity dependent on said first signal component ($\hat{i}_d$).

3. The predistorter according to claim 2 wherein said fifth means (2) for generating an estimate of said drain voltage variations ($\hat{\delta}_v$) includes at least a FIR filter or an IIR filter.

4. The predistorter according to claim 1 wherein said first means (1) for generating a first signal component ($\hat{i}_d$) includes at least a FIR filter or an IIR filter.

5. The predistorter according to claim 1 wherein said second means (8) for generating said second signal component ($v_8$) is a nonlinear filter described by a filter function $$\sum_{m=0}^{2} \hat{i}_d[n-m] \cdot h_{1m}(|\hat{i}_d[n-k]|),$$

wherein $\hat{i}_d[n-m]$ represents said first signal component ($\hat{i}_d$) time-delayed by m, and $h_{1m}(|\hat{i}_d[n-k]|)$ represents said first gain function, and $\hat{i}_d[n-k]$ represents said selected time-delayed version of said first signal component ($\hat{i}_d$).

6. The predistorter according to claim 1 wherein said third means (9) for generating said third signal component ($v_9$) is a nonlinear filter described by a filter function $$\sum_{m=0}^{2} \hat{i}_d^*[n-m] \cdot \hat{i}_d^2[n-k] \cdot h_{2m}(|\hat{i}_d[n-k]|),$$

wherein $\hat{i}_d^*[n-m]$ represents a conjugate of said first signal component ($\hat{i}_d$) time-delayed by m, and $h_{2m}(|\hat{i}_d[n-k]|)$ represents said second gain function, and $\hat{i}_d[n-k]$ represents said selected time-delayed version of said first signal component ($\hat{i}_d$).

7. The predistorter according to claim 1 wherein said predistorter further includes sixth means (4) for generating a fourth signal component ($v_4$), which sixth means (4) is a filter described by a filter function $$\hat{i}_d[n-k] \cdot f_0(|\hat{i}_d[n-k]|),$$

wherein $\hat{i}_d[n-k]$ represents said selected time-delayed version of said first signal component ($\hat{i}_d$) and $f_0(|\hat{i}_d[n-k]|)$ represents the memoryless behaviour of said amplifier, and wherein said fourth means (7) are arranged to combine at least said second, said third and said fourth signal components to form said output signal ($v_g$).

8. The predistorter according to claim 1 wherein said predistorter is particularly arranged to predistort a conventional power amplifier.

9. The predistorter according to claim 1 wherein said predistorter is particularly arranged to predistort a Doherty power amplifier.

10. The predistorter according to claim 1 wherein said predistorter is particularly arranged to predistort a Chireix power amplifier.

11. A method for reducing frequency memory effects in a RF power amplifier using a predistorter having an input signal (x) and an output signal ($v_g$), wherein said method comprises the steps of generating (S1) a first signal component ($\hat{i}_d$) by estimating a drain current of said power amplifier using a linear filter;

generating (S2) a second signal component ($v_g$) as a function of said first signal component ($\hat{i}_d$) and at least one first gain function ($h_{10}$, $h_{11}$, $h_{12}$, $f_1$), which at least one first gain function ($h_{10}$, $h_{11}$, $h_{12}$, $f_1$) represents the sensitivity of the power amplifier and is a function of the amplitude of a selected time-delayed version ($v_3$) of said first signal component ($\hat{i}_d$);

generating (S3) a third signal component ($v_9$) as a function of a conjugate of said first signal component ($\hat{i}_d$) and at least one second gain function ($h_{20}$, $h_{21}$, $h_{22}$, $f_2$), which at least one second gain function ($h_{20}$, $h_{21}$, $h_{22}$, $f_2$), represents the sensitivity of the power amplifier and is a function of the amplitude of said selected time-delayed version ($v_3$) of said first signal component ($\hat{i}_d$); and generating (S5) said output signal ($v_g$) by combining (S4) at least said second signal component ($v_g$) and said third signal component ($v_9$).

12. The method according to claim 11 further comprising the step of generating an estimate of drain voltage variations ($\hat{\delta}_v$) of said power amplifier as a function of a filtered linearity dependent on said first signal component ($\hat{i}_d$).

13. The method according to claim 12 wherein the step of generating an estimate of drain voltage variations ($\hat{\delta}_v$) comprises passing said first signal component ($\hat{i}_d$) through at least a linear FIR filter or an IIR filter.

14. The method according to claim 11 wherein the step (S1) of generating said first signal component ($\hat{i}_d$) comprises passing said input signal (x) through a FIR filter or an IIR filter.

15. The method according to claim 11 wherein the step (S2) of generating said second signal component ($v_g$) comprises using a nonlinear filter described by a filter function $$\sum_{m=0}^{2} \hat{i}_d[n-m] \cdot h_{1m}(|\hat{i}_d[n-k]|),$$

wherein $\hat{i}_d[n-m]$ represents said first signal component ($\hat{i}_d$) time-delayed by m, and $h_{1m}(|\hat{i}_d[n-k]|)$ represents said first gain function, and $\hat{i}_d[n-k]$ represents said selected time-delayed version of said first signal component ($\hat{i}_d$).

16. The method according to claim 11 wherein the step (S3) of generating said third signal component ($v_9$) comprises using a nonlinear filter described by a filter function $$\sum_{m=0}^{2} \hat{i}_d^*[n-m] \cdot \hat{i}_d^2[n-k] \cdot h_{2m}(|\hat{i}_d[n-k]|),$$

wherein $\hat{i}_d^*[n-m]$ represents a conjugate of said first signal component ($\hat{i}_d$) time-delayed by m, and $h_{2m}(|\hat{i}_d[n-k]|)$ represents said second gain function, and $\hat{i}_d[n-k]$ represents said selected time-delayed version of said first signal component ($\hat{i}_d$).

17. The method according to claim 11 further comprising a step of generating a fourth signal component ($v_4$) using a filter described by a filter function $$\hat{i}_d[n-k] \cdot f_0(|\hat{i}_d[n-k]|),$$

wherein $\hat{i}d[n-k]$ represents said selected time-delayed version of said first signal component ($\hat{i}_d$), and $f_0(|\hat{i}_d[n-k]|)$ represents the memoryless behaviour of said amplifier, and wherein said step (S5) of generating said output signal ($v_g$) includes combining said second, said third and said fourth signal components.

18. A base station (10) of a telecommunications system including a predistorter according to claim 1.

* * * * *

UNITED STATES PATENT AND TRADEMARK OFFICE
CERTIFICATE OF CORRECTION

PATENT NO.       : 7,755,425 B2
APPLICATION NO.  : 12/296324
DATED            : July 13, 2010
INVENTOR(S)      : Klingberg et al.

It is certified that error appears in the above-identified patent and that said Letters Patent is hereby corrected as shown below:

In Column 1, Line 58, delete "24 no. 9." and insert -- 24, no. 9, --, therefor.

In Column 6, Line 3, delete "Chierex" and insert -- Chireix --, therefor.

In Column 6, Line 21, delete "Chierex" and insert -- Chireix --, therefor.

In Column 6, Line 64, in Equation (3), delete "$Z_{id}[m]$," and insert -- $Z_{ld}[m]$ --, therefor.

In Column 7, Line 11, delete "$v_1[n]$," and insert -- $v_l[n]$ --, therefor.

In Column 8, Line 48, delete "$\hat{i}_d[n]$," and insert -- $\hat{i}_d[n]$, --, therefor.

In Column 8, Line 58, delete "$\hat{i}_g[n]$" and insert -- $\hat{i}_d[n]$ --, therefor.

In Column 9, Lines 4-5, in Equation (10), delete "
$$v_g[n] \approx \hat{i}_d[n-k] \cdot f_0(|\hat{i}_d[n-k]|) + \hat{\delta}_v[n] \cdot f_1(|\hat{i}_d[n-k]|) + \hat{\delta}_v^*[n] \cdot \hat{i}_d^2[n-k] \cdot f_2(|\hat{i}_d[n-k]|)$$
"

and insert --
$$v_g[n] \approx \hat{i}_d[n-k] \cdot f_0(|\hat{i}_d[n-k]|) + \hat{\delta}_v[n] \cdot f_1(|\hat{i}_d[n-k]|) + \hat{\delta}_v^*[n] \cdot \hat{i}_d^2[n-k] \cdot f_2(|\hat{i}_d[n-k]|)$$
--, therefor.

In Column 9, Line 7, delete "$f_0(|\hat{i}_d[n-k]|)$," and insert -- $f_0(|\hat{i}_d[n-k]|)$ --, therefor.

Signed and Sealed this
Twenty-ninth Day of March, 2011

David J. Kappos
*Director of the United States Patent and Trademark Office*

In Column 9, Line 9, delete "$\hat{i}_d[n-k]$" and insert -- $\hat{i}_d[n-k]$ --, therefor.

In Column 9, Line 11, delete "$\hat{i}_{d^*}$" and insert -- $\hat{i}_{d^*}$ --, therefor.

In Column 9, Line 11, delete "$f_1(|\hat{i}_d[n-k]|)$" and insert -- $f_1(|\hat{i}_d[n-k]|)$ --, therefor.

In Column 9, Line 11, delete "$f_2(|\hat{i}_d[n-$" and insert -- $f_2(|\hat{i}_d[n-$ --, therefor.

In Column 9, Line 15, delete "$f_0(|\hat{i}_d[n]|), f_1(|\hat{i}_d[n]|), f_2(|\hat{i}_d[n]|)$" and insert -- $f_0(|\hat{i}_d[n]|), f_1(|\hat{i}_d[n]|), f_2(|\hat{i}_d[n]|)$ --, therefor.

In Column 9, Line 21, delete "$f_1(|\hat{i}_d$" and insert -- $f_1(|\hat{i}_d$ --, therefor.

In Column 9, Line 22, delete "$f_2(|\hat{i}_d[n-k]|)$" and insert -- $f_2(|\hat{i}_d[n-k]|)$ --, therefor.

In Column 9, Line 34, delete "$f_0(|\hat{i}_d[n-k]|)$" and insert -- $f_0(|\hat{i}_d[n-k]|)$ --, therefor.

In Column 9, Line 35, delete "$h_{1m}(|\hat{i}_d$" and insert -- $h_{1m}(|\hat{i}_d$ --, therefor.

In Column 9, Line 36, delete "$h_{2m}(|\hat{i}_d[n-k]|)$" and insert -- $h_{2m}(|\hat{i}_d[n-k]|)$ --, therefor.

In Column 9, Line 37, delete "$|\hat{i}_d[n-k]|,$" and insert -- $|\hat{i}_d[n-k]|,$ --, therefor.

In Column 9, Line 38, delete "$\hat{i}_{d^*}$" and insert -- $\hat{i}_{d^*}$ --, therefor.

In Column 9, Line 48, delete "$f_0(|\hat{i}_d[n-k]|),$" and insert -- $f_0(|\hat{i}_d[n-k]|),$ --, therefor.

In Column 9, Line 48, delete "$h_{1m}(|\hat{i}_d[n-k]|),$" and insert -- $h_{1m}(|\hat{i}_d[n-k]|),$ --, therefor.

In Column 9, Line 48, delete "$h_{2m}(|\hat{i}_d[n-k]|),$" and insert -- $h_{2m}(|\hat{i}_d[n-k]|),$ --, therefor.

In Column 9, Line 51, delete "$f_0(|\hat{i}_d[n-k]|),$" and insert -- $f_0(|\hat{i}_d[n-k]|),$ --, therefor.

CERTIFICATE OF CORRECTION (continued)
U.S. Pat. No. 7,755,425 B2

In Column 9, Line 51, delete "$h_{1m}(|\hat{i}_d[n-k]|),$" and insert -- $h_{1m}(|\hat{i}_d[n-k]|),$ --, therefor.

In Column 9, Line 52, delete "$h_{2m}(|\hat{i}_d[n-k]|)$" and insert -- $h_{2m}(|\hat{i}_d[n-k]|)$ --, therefor.

In Column 9, Lines 60-65, in Equation (12), delete "
$$v_g[n] \approx \hat{i}_d[n] \cdot f_0(|\hat{i}_d[n]|) + \hat{\delta}_v[n] \cdot f_1(|\hat{i}_d[n]|) + \\ \hat{\delta}_v^*[n] \cdot \hat{i}_d^2[n] \cdot f_2(|\hat{i}_d[n]|) + + \\ \hat{\delta}_v^2[n] \cdot \hat{i}_d^*[n] \cdot f_3(|\hat{i}_d[n]|) + | \\ \hat{\delta}_v[n]|^2 \cdot \hat{i}_d[n] \cdot f_4(|\hat{i}_d[n]|) + ( \\ \hat{\delta}_v^*[n])^2 \cdot \hat{i}_d^3[n] \cdot f_5(|\hat{i}_d[n]|)$$
"

and insert --
$$v_g[n] \approx \hat{i}_d[n] \cdot f_0(|\hat{i}_d[n]|) + \hat{\delta}_v[n] \cdot f_1(|\hat{i}_d[n]|) + \\ \hat{\delta}_v^*[n] \cdot \hat{i}_d^2[n] \cdot f_2(|\hat{i}_d[n]|) + + \\ \hat{\delta}_v^2[n] \cdot \hat{i}_d^*[n] \cdot f_3(|\hat{i}_d[n]|) + | \\ \hat{\delta}_v[n]|^2 \cdot \hat{i}_d[n] \cdot f_4(|\hat{i}_d[n]|) + ( \\ \hat{\delta}_v^*[n])^2 \cdot \hat{i}_d^3[n] \cdot f_5(|\hat{i}_d[n]|)$$
--, therefor.

In Column 10, Line 6, delete "$\hat{i}_d$" and insert -- $\hat{i}_d$ --, therefor.

In Column 10, Line 13, delete "$\hat{i}_d;$" and insert -- $\hat{i}_d;$ --, therefor.

In Column 2, Line 17, delete "is" and insert -- as --, therefor.

In Column 10, Line 34, delete "$v_4 = \hat{i}_d[n-k] \cdot f_0(|\hat{i}_d[n-k]|)$" and insert -- $v_4 = \hat{i}_d[n-k] \cdot f_0(|\hat{i}_d[n-k]|)$ --, therefor.

In Column 10, Line 36, delete "$(|\hat{i}_d[n-k]|)$" and insert -- $(|\hat{i}_d[n-k]|)$ --, therefor.

In Column 10, Line 39, delete "$v_6 = \hat{\delta}_v^*[n] \cdot \hat{i}_d^2[n-k] \cdot f_2(|\hat{i}_d[n-k]|)$" and insert -- $v_6 = \hat{\delta}_v^*[n] \cdot \hat{i}_d^2[n-k] \cdot f_2(|\hat{i}_d[n-k]|)$ --, therefor.

In Column 10, Line 47, delete "$v_3 = \hat{i}_d[n-k]$" and insert -- $v_3 = \hat{i}_d[n-k]$ --, therefor.

In Column 10, Line 56, delete "$(|\hat{i}_d[n-k]|)$" and insert -- $(|\hat{i}_d[n-k]|)$ --, therefor.

CERTIFICATE OF CORRECTION (continued)
U.S. Pat. No. 7,755,425 B2

In Column 10, Line 65, delete "$(|\hat{i}_d[n-k]|),$" and insert -- $(|\hat{i}_d[n-k]|),$ --, therefor.

In Column 10, Line 66, delete "$\hat{\delta}_v^*[n] \cdot \hat{i}_d^{\,2}[n-k] \cdot f_2(|\hat{i}_d[n-k]|)$" and insert -- $\hat{\delta}_v^*[n] \cdot \hat{i}_d^{\,2}[n-k] \cdot f_2(|\hat{i}_d[n-k]|)$ --, therefor.

In Column 11, Line 9, delete "$\hat{i}_d$" and insert -- $\hat{i}_d$ --, therefor.

In Column 11, Line 13, delete "$\hat{i}_d$" and insert -- $\hat{i}_d$ --, therefor.

In Column 11, Line 16, delete "$\hat{i}_{d^*}$" and insert -- $\hat{i}_{d^*}$ --, therefor.

In Column 11, Line 18, delete "$\hat{i}_{d^*}$" and insert -- $\hat{i}_{d^*}$ --, therefor.

In Column 11, Line 21, delete "$\hat{i}_{d^*}$" and insert -- $\hat{i}_{d^*}$ --, therefor.

In Column 11, Line 28, delete "$v_4 = \hat{i}_d[n] \cdot f_0(|\hat{i}_d[n-k]|)$" and insert -- $v_4 = \hat{i}_d[n] \cdot f_0(|\hat{i}_d[n-k]|)$ --, therefor.

In Column 11, Line 53, delete "$v_3 = \hat{i}_d[n-k]$" and insert -- $v_3 = \hat{i}_d[n-k]$ --, therefor.

In Column 2, Line 26, delete "$\hat{i}_d$" and insert -- $\hat{i}_d$ --, therefor.

In Column 12, Line 29, delete "$\hat{i}_d$" and insert -- $\hat{i}_d$ --, therefor.

In Column 12, Line 34, delete "$\hat{i}_{d^*}$" and insert -- $\hat{i}_{d^*}$ --, therefor.

In Column 12, Line 36, delete "$\hat{i}_d$" and insert -- $\hat{i}_d$ --, therefor.

In Column 12, Line 38, delete 71 ₂" and insert -- $f_2$ --, therefor.

CERTIFICATE OF CORRECTION (continued)

In Column 12, Line 41, delete "$\hat{1}_{d^*}$" and insert -- $\hat{i}_{d^*}$ --, therefor.

In Column 13, Line 20, delete "tor" and insert -- for --, therefor.

In Column 2, Line 52, in Claim 1, delete "$(\hat{1}_d),$" and insert -- $(\hat{i}_d),$ --, therefor.

In Column 13, Line 57, in Claim 1, delete "$(\hat{1}_d)$" and insert -- $(\hat{i}_d)$ --, :herefor.

In Column 13, Line 62, in Claim 1, delete "$(\hat{1}_d);$" and insert -- $(\hat{i}_d);$ --, therefor.

In Column 13, Line 65, in Claim 1, delete "$(\hat{1}_d)$" and insert -- $(\hat{i}_d)$ --, therefor.

In Column 14, Line 3, in Claim 1, delete "$(\hat{1}_d);$" and insert -- $(\hat{i}_d);$ --, therefor.

In Column 14, Line 11, in Claim 2, delete "$\hat{1}_{d^*}$" and insert -- $\hat{i}_{d^*}$ --, therefor.

In Column 14, Line 17, in Claim 4, delete "$(\hat{1}_d)$" and insert -- $(\hat{i}_d)$ --, therefor.

In Column 14, Line 28, in Claim 5, delete "$\hat{1}_d[n-m]$" and insert -- $\hat{i}_d[n-m]$ --, therefor.

In Column 14, Line 28, in Claim 5, delete "$(\hat{1}_d)$" and insert -- $(\hat{i}_d)$ --, therefor.

In Column 14, Line 29, in Claim 5, delete "$(|\hat{1}_d[n-k]|)$" and insert -- $(|\hat{i}_d[n-k]|)$ --, therefor.

In Column 14, Line 30, in Claim 5, delete "$\hat{1}_d[n-k]$" and insert -- $\hat{i}_d[n-k]$ --, therefor.

In Column 14, Line 31, in Claim 5, delete "$\hat{1}_{d^*}$" and insert -- $\hat{i}_{d^*}$ --, therefor.

In Column 14, Line 41, in Claim 6, delete "$\hat{1}_d^*[n-m]$" and insert -- $\hat{i}_d^*[n-m]$ --, therefor.

In Column 2, Line 42, in Claim 6, delete "$(\hat{1}_d)$" and insert -- $(\hat{i}_d)$ --, therefor In Column 14, Line 42, in Claim 6, delete "$h_{2m}(|\hat{i}_d[n-k]|)$" and

CERTIFICATE OF CORRECTION (continued)
U.S. Pat. No. 7,755,425 B2 insert -- $h_{2m}(|\hat{i}_d[n-k]|)$ --, therefor.

In Column 14, Line 43, in Claim 6, delete "$\hat{i}_d[n-k]$," and insert -- $\hat{i}_d[n-k]$ --, therefor.

In Column 14, Line 45, in Claim 6, delete "$(\hat{i}_d)$.," and insert -- $(\hat{i}_d)$. --, therefor.

In Column 14, Line 51, in Claim 7, delete "$\hat{i}_d[n-k] \cdot f_0(|\hat{i}_d[n-k]|),$," and insert -- $\hat{i}_d[n-k] \cdot f_0(|\hat{i}_d[n-k]|),$ --, therefor.

In Column 14, Line 52, in Claim 7, delete "$\hat{i}_d[n-k]$," and insert -- $\hat{i}_d[n-k]$ --, therefor.

In Column 2, Line 53, in Claim 7, delete "$(\hat{i}_d)$ and $f_0(|\hat{i}_d[n-k]|)$," and insert -- $(\hat{i}_d)$, and $f_0(|\hat{i}_d[n-k]|)$ --, therefor.

In Column 15, Line 5, in Claim 11, delete "$(\hat{i}_d)$" and insert -- $(\hat{i}_d)$ --, therefor.

In Column 15, Line 9, in Claim 11, delete "$(\hat{i}_d)$" and insert -- $(\hat{i}_d)$ --, therefor.

In Column 15, Line 14, in Claim 11, delete "$(\hat{i}_d);$," and insert -- $(\hat{i}_d);$ --, therefor.

In Column 15, Line 16, in Claim 11, delete "$(\hat{i}_d)$" and insert -- $(\hat{i}_d)$ --, therefor.

In Column 15, Line 21, in Claim 11, delete "$(\hat{i}_d);$" and insert -- $(\hat{i}_d);$ --, therefor.

In Column 15, Line 23, in Claim 11, delete "$(v_g)$," and insert -- $(v_g)$ --, therefor.

In Column 2, Line 28, in Claim 12, delete "$(\hat{i}_d)$." and insert -- $(\hat{i}_d)$. --, therefor.

In Column 15, Line 31, in Claim 13, delete "$(\hat{i}_d)$" and insert -- $(\hat{i}_d)$ --, therefor.

In Column 15, Line 34, in Claim 14, delete "$(\hat{i}_d)$" and insert -- $(\hat{i}_d)$ --, therefor.

In Column 16, Line 7, in Claim 15, delete "$\hat{i}_d[n-m]$" and insert -- $\hat{i}_d[n-m]$ --, therefor.

In Column 16, Line 7, in Claim 15, delete "$(\hat{i}_d)$" and insert -- $(\hat{i}_d)$ --, therefor.

In Column 16, Line 8, in Claim 15, delete "$h_{1m}(|\hat{i}_d[n-k]|)$," and

CERTIFICATE OF CORRECTION (continued)
U.S. Pat. No. 7,755,425 B2 insert -- $h_{1m}(|\hat{i}_d[n-k]|)$ --, therefor.

In Column 2, Line 9, in Claim 15, delete " $\hat{i}_d[n-k]$ ," and insert -- $\hat{i}_d[n-k]$ --, therefor.

In Column 16, Line 10, in Claim 15, delete " $(\hat{i}_d)$ ." and insert -- $(\hat{i}_d)$ . --, therefor.

In Column 16, Line 20, in Claim 16. delete " $\hat{i}_d^*[n-m]$ ," and insert -- $\hat{i}_d^*[n-m]$ --, therefor.

In Column 16, Line 21, in Claim 16, delete " $(\hat{i}_d)$ ," and insert -- $(\hat{i}_d)$ --, therefor.

In Column 16, Line 21, in Claim 16, delete " $h_{2m}(|\hat{i}_d[n-k]|)$ ," and insert -- $h_{2m}(|\hat{i}_d[n-k]|)$ --, therefor.

In Column 16, Line 22, in Claim 16, delete " $\hat{i}_d[n-k]$ ," and insert -- $\hat{i}_d[n-k]$ --, therefor.

In Column 16, Line 24, in Claim 16, delete " $(\hat{i}_d)$ ." and insert -- $(\hat{i}_d)$ . --, therefor.

In Column 16, Line 29, in Claim 17, delete " $\hat{i}_d[n-k] \cdot f_0(|\hat{i}_d[n-k]|)$, " and insert -- $\hat{i}_d[n-k] \cdot f_0(|\hat{i}_d[n-k]|)$ --, therefor.

In Column 16, Line 30, in Claim 17, delete " $\hat{i}d[n-k]$ ," and insert -- $\hat{i}_d[n-k]$ --, therefor.

In Column 16, Line 31, in Claim 17, delete " $(\hat{i}_d)$, and $f_0(|\hat{i}_d[n-k]|)$ ," and insert -- $(\hat{i}_d)$, and $f_0(|\hat{i}_d[n-k]|)$ --, therefor.